United States Patent [19]
Wendt et al.

[11] Patent Number: 5,411,937
[45] Date of Patent: May 2, 1995

[54] JOSEPHSON JUNCTION

[75] Inventors: Joel R. Wendt; Thomas A. Plut, both of Albuquerque, N. Mex.; Jon S. Martens, Sunnyvale, Calif.

[73] Assignee: Sandia Corporation, Albuquerque, N. Mex.

[21] Appl. No.: 62,672

[22] Filed: May 17, 1993

[51] Int. Cl.$^6$ ............................................. H01L 21/00
[52] U.S. Cl. .................................. 505/329; 505/410; 505/413; 505/702; 505/728; 216/41; 216/3
[58] Field of Search ..................... 156/655, 659.1, 656; 505/410, 329, 413, 702, 728

[56] References Cited

U.S. PATENT DOCUMENTS

| | | | |
|---|---|---|---|
| 4,985,117 | 1/1991 | Kurosawa et al. | 156/659.1 |
| 4,997,522 | 3/1991 | Shokoohi | 156/659.1 |
| 5,016,128 | 5/1991 | DiIorio et al. | 505/171 |
| 5,034,374 | 7/1991 | Awaji et al. | 505/329 |
| 5,041,415 | 8/1991 | Frenkel et al. | 505/202 |
| 5,057,491 | 10/1991 | Houseley | 505/190 |
| 5,109,164 | 4/1992 | Matsui | 307/306 |
| 5,350,739 | 9/1994 | Martens et al. | 505/211 |

OTHER PUBLICATIONS

K. P. Daly, et al, "Substrate Step-Edge YBa$_2$Cu$_3$O$_7$ rfSQUIDS," Appl. Phys. Lett. 58 (5), pp. 543–545, Feb. 4, 1991.
K. Char et al, "Bi-epitaxial Grain Boundary Juntions in YBa$_2$Cu$_3$O$_7$," Appl. Phys. Lett. 59 (6), pp. 733–735, Aug. 5, 1991.
Carol I. H. Ashby et al, "Improved Aqueous Etchant for High T$_c$ Superconductor Materials," Appl. Phys. Lett. 60 (17), pp. 2147–2149, Apr. 27, 1992.
J. R. Wendt et al, "YBa$_2$Cu$_3$O$_7$ Nanobridges Fabricated by Direct-Write Electron Beam Lithography," Appl. Phys. Lett., 61 (13) pp. 1597–1599, Sep. 28, 1992.
J. S. Martens et al, "High Temperature Superconducting Josephson Transmission Lines for Pulse and Step Sharpening," J. Applied Phys. 72 (12), pp. 5970–5974, Dec. 15, 1992.
D. Dimos, et al, "Orientation Dependence of Grain-Boundary Critical Currents in YBa$_2$Cu$_3$O$_{7-\delta}$ Bicrystals," The American Physical Society, Physical Review Letters, vol. 61 (2), pp. 219–222, Jul. 11, 1988.
Z. Bao et al, "Fabrication and Measurement of Submicron Planar YBa$_2$Cu$_3$O$_7$ Microbridge Josephson Junctions," Proceedings-IEEE Transactions on Applied Superconductivity, vol. 3 (1) pp. 2417–2420, Mar. 1993.
X. Chen et al, "Measurement of Conduction Properties of Highly Resistive Superconducting Microbridges," Proceedings-IEEE Transactions on Applied Superconductivity, vol. 3, (1), pp. 1991–1994, Mar. 1993.
C. H. Park et al, "Millimeter Wave Responses of YBCO Variable-Thickness Bridges," Proceedings-IEEE Transactions on Applied Superconductivity, vol. 3, (1) pp. 2409–2412, Mar. 1993.

Primary Examiner—Thi Dang
Attorney, Agent, or Firm—Timothy D. Stanley

[57] ABSTRACT

A novel method for fabricating nanometer geometry electronic devices is described. Such Josephson junctions can be accurately and reproducibly manufactured employing photolithographic and direct write electron beam lithography techniques in combination with aqueous etchants. In particular, a method is described for manufacturing planar Josephson junctions from high temperature superconducting material.

11 Claims, 7 Drawing Sheets

JOSEPHSON JUNCTION

The United States Government has rights in this invention pursuant to Contract No. DE-AC04-76DP00789 between the Department of Energy and American Telephone and Telegraph Company.

BACKGROUND OF THE INVENTION

The present invention relates generally to lithographic processes for fabricating nanometer geometry electronic devices and more particularly to processes for fabricating high temperature superconducting material Josephson junctions.

The operation of Josephson junctions was initially depicted as a tunneling effect in superconducting materials in which a supercurrent flows between superconducting materials separated by a quantum barrier, such as a thin insulating film. Subsequently, the superconductive effect was observed with other quantum barriers (e.g. grain boundary junctions, point contact junctions as well as bridge junctions). To differentiate the latter quantum barrier junctions from the insulating film junctions, they are generally referred to as weak link junctions. Amongst the weak link junctions, bridge junctions can generally be differentiated from point contact and grain boundary junctions as being planar. Moreover, many weak link junctions, especially bridge junctions, can be characterized by current-voltage relations free from hysteresis due to their low capacitances. There are typically two modes of operation of a Josephson junction. In the zero-voltage mode, a supercurrent flows across the barrier or junction until it reaches a critical value (e.g. $I_c$). In the non zero-voltage mode, current oscillations of a frequency proportional to the applied voltage occur and if irradiated with electromagnetic waves, current steps will appear at equal voltage intervals on a current-voltage display.

Unfortunately, the practical utility of Josephson junctions has been limited by the very low critical temperatures ($T_c$) of many superconducting materials. With the discovery of high temperature superconducting (HTS) materials ($T_c > 77°$ K.), interest has once again been renewed in Josephson junctions since such superconducting temperatures are more practically and commercially achievable. However, fabrication of Josephson junctions with HTS materials has proven to be extremely difficult because of their reactivity with most conventional dielectric materials and the high temperature deposition processes associated with such HTS materials. Moreover, one of the outstanding problems impeding the manufacture of superconducting electronics made from HTS materials is the inability of existing fabrication processes to provide accurate and reproducible positioning, orientation and density of such electronic devices. Typically, most existing HTS material Josephson junctions rely on the fabrication of grain boundary junctions. Unfortunately, the uniformity and manufacturing yield of such grain boundary processes is poor and positioning, as well as orientation and density of placement of such electronic devices is extremely limited. Moreover, such grain boundary junctions are extremely sensitive to minute changes in the deposition of the HTS material further reducing the yield of such processes.

The use of submicron geometries has been found useful for the high-frequency operation of Josephson junctions fabricated from HTS materials as a consequence of their resulting capacitances and density of placement of such devices. Matsui in U.S. Pat. No. 5,109,164 has described the length of the bridge as critical to the operation of weak link Josephson junctions. In particular, Matsui has indicated that the bridge length must be between 1 and 5.31 times the coherence length of the superconducting material wave function. Unfortunately, as the critical temperature ($T_c$) of superconducting materials has increased, the coherence length for bridge-type Josephson junctions has decreased. This is especially pronounced in HTS materials. However, current fabrication techniques are inadequate to reproducibly achieve such dimensions. Recognizing such short coming, Matsui developed an alternative fabrication technique whereby accurate control of bridge length and width was not needed.

Several processes for the fabrication of Josephson junctions from HTS materials have been reported by Gross et al in Appl. Phys. Lett. 57, 727 (1990) and Char et al in Appl. Phys. Lett. 59, 733 (1991) and involve the engineered fabrication of grain boundaries as the quantum barrier. These techniques are not amenable to circuit fabrication because of the difficulty in controlling both the number and placement of the grain boundaries. The first grain boundary formation process uses custom $SrTiO_3$ substrates made with two crystallographic orientations present. A HTS film grows following these orientations and a high angle, Josephson-like grain boundary forms at the interface. A refinement of this process uses a seed layer, deposited on the substrate, to form the basis for the other axis of growth. Another approach described by Daly et al in "Substrate Step-edge $YBa_2Cu_3O_7$ of Squids," Appl. Phys. Lett. 58, 543 (1991) has been to form step-edge junctions by patterning the substrate prior to deposition of the superconducting thin film. Film growth on these substrates quite reproducibly forms a grain boundary at the etched step. While this technique is more controllable than the use of bi-crystalline substrates, it introduces additional processing that can degrade the surface of the starting substrate prior to deposition of the HTS material.

A more elaborate process for fabricating Josephson junctions described by Kern et al in J. Vac. Sci. Tech Bg, 2815 (1991) uses selective epitaxy on a substrate having a patterned silicon nitride overlayer. Electron beam lithography is used to pattern the silicon nitride film rather than the HTS material directly. Using this technique, bridges of HTS material down to 0.13 $\mu$m have been formed but achieving finer resolution is limited by particulate formation during HTS deposition. Additionally, there are concerns about stress in the grown films and silicon outdiffusion from the silicon nitride mask. Electron beam lithography has also been used in combination with ion milling to pattern an HTS film directly for the fabrication of grain boundary junction. The minimum reported feature size obtained via this technique was 0.25 $\mu$m, limited in part by the use of a thick, negative electron beam resist. Additionally, damage to the HTS film induced by the ion milling process can unacceptably degrade the HTS film characteristics as linewidths are reduced to 0.1 $\mu$m and below.

Consequently, a need continues to exist for accurate and reproducible techniques to manufacture Josephson junctions employing HTS materials and having submicron dimensions. The present invention provides a novel direct-write electron beam lithography process in conjunction with a wet etch to reproducibly and accurately fabricate Josephson junction bridges of nanometer geometries.

SUMMARY OF THE INVENTION

The present invention provides a novel method for lithographically fabricating nanometer scale geometries in electronic devices and more particularly to methods for fabricating planar Josephson junctions from high temperature superconducting (HTS) material. In particular, the Josephson junctions of the present invention comprise first and second regions of superconducting material interconnected by a conductive bridge, wherein the bridge length is less than 100 nm. The first and second regions as well as the conductive bridge are coplanar. In one embodiment, the superconductive materials have critical temperatures ($T_c$) greater than 77° K. Preferably, the superconducting materials are cuprate oxide alloys.

Unlike existing technologies for fabricating Josephson junctions from HTS materials employing grain boundaries, the present invention is a fabrication technique which provides for accurate and reproducible positioning, orientation and density of Josephson junctions on a substrate. In particular, planar Josephson junctions can be formed employing a direct write electron beam lithography and an aqueous etch to form bridges of less than 100 nm in length. Initially, the macro features of a Josephson junction can be defined by optical lithography and etching of the HTS material. Thereafter, a pair of opposed, single pass electron beams can define a bridge pattern on a positive resist overlaying the HTS material. By removing the exposed resist and etching away the exposed HTS material, a nanometer dimensioned, planar Josephson junction can be formed which is particularly useful for high speed operations. These and other features of the present invention will become more apparent with the following detailed description made with reference to the included drawings.

DETAILED DESCRIPTION OF THE INVENTION

Unlike prior Josephson junctions fabricated with high temperature superconducting (HTS) materials employing grain boundaries as quantum barriers, the present invention provides a novel method for fabricating a Josephson junction with HTS material wherein the superconducting regions are interconnected by a conductive bridge of nanometer dimensions. Moreover, the Josephson junction of the present invention is planar unlike the gain boundary quantum barriers thus greatly simplifying the manufacturing process. An additional beneficial result of such nanometer dimensioned, planar Josephson junctions is their low capacitance and application to high speed electronic devices.

Figure 1:
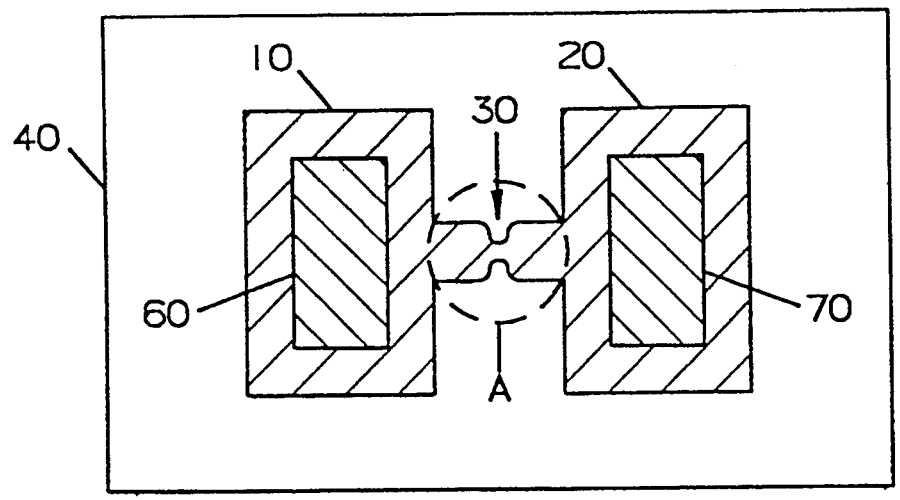
FIG. 1 depicts a bridge-type Josephson junction.

Looking now to FIG. 1, a Josephson junction according to the present invention is depicted. First and second superconducting regions 10, 20 respectively are interconnected by a conductive bridge 30 all of which are deposited on a substrate 40. Preferably, the first and second superconducting regions 10, 20 as well as the conductive bridge 30 are composed of a high temperature superconducting (HTS) material. As used within the art, HTS materials are generally those having a critical temperature ($T_c > 77°$ K.) and can be selected from superconducting metallic oxides of copper, e.g. $BiSrCa_2Cu_3O_x$, $Tl_2Ba_2Ca_2Cu_3O_x$ and $LBa_2Cu_3O_7$ (where L can be Y, Dv or Er). Preferably the superconducting material is $YBa_2Cu_3O_7$(YBCO). Additionally, each of the superconducting regions 10, 20 can include silver contact pads 60, 70 respectively for impressing or measuring voltage or current there across. As will be discussed in more detail below, an important aspect of the present invention resides in accurately and reproducibly producing nanometer dimensioned bridge 30.

The present method combines direct-write electron beam lithography utilizing a thin, positive electron beam resist having an ultimate resolution smaller than 20 nm with an aqueous etchant to fabricate nanometer dimensioned bridges of epitaxially deposited HTS materials. This technique allows the fabrication of Josephson junctions at arbitrary positions, orientations, and density, resulting in minimal constraints on the design of superconducting circuits and without the requirement for grain boundary formation. Moreover, such process can more accurately and reproducibly obtain the required nanometer geometries as will be discussed in more detail below.

Figure 2:
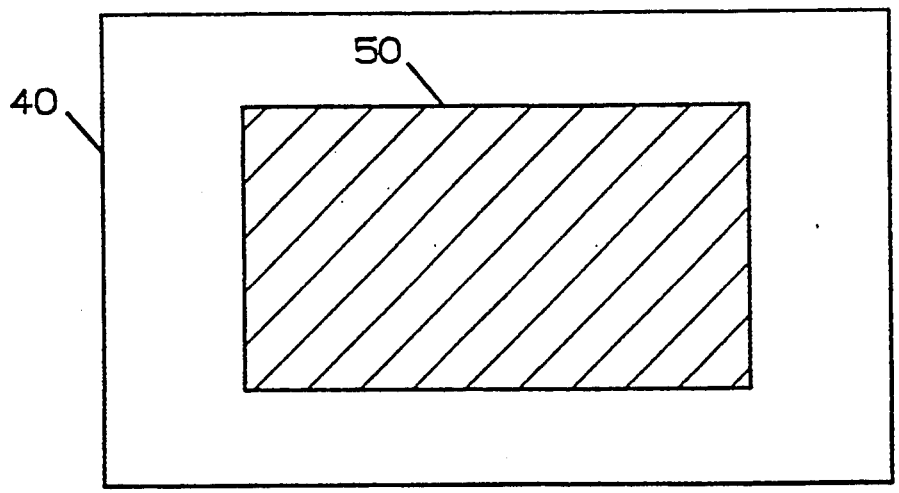
FIG. 2 depicts a thin film of HTS material deposited on a substrate.

The superconducting regions 10, 20, as well as the bridge 30 in FIG. 1 comprise HTS material. Preferably, the HTS material is YBCO which can be formed by the deposition of Y and Cu metals (which are evaporated from separate electron gun sources) and $BaF_2$ (by resistive evaporation) onto a $LaAlO_3$ substrate. Those skilled in the art will appreciate there are a plurality of techniques which can be used for depositing HTS material on a substrate FIG. 2 depicts a thin film of HTS material 50 which has been epitaxially deposited onto substrate 40. The HTS film 50 is nominally 25 nm thick and is epitaxially oriented with its c-axis normal to the substrate 40. The HTS film 50 of YBCO can then be annealed ex-situ so as to produce a $T_c$ of about 90K and critical current densities at 77K (0 field) of about 1 $MA/cm^2$.

As will be more completely described in conjunction with FIGS. 2–5, a process for manufacturing Josephson junctions from HTS materials will be discussed below. In particular, three optical lithographic process steps are performed on the deposited HTS film of FIG. 2 and then an electron beam lithographic step whereby a Josephson junction as depicted in FIG. 1 can be obtained. The optical lithographic steps include deposition of Ag contacts (which also includes the deposition of the alignment marks used by the electron beam lithography system to align the optical levels), mesa etching for delineation of the macro features of the Josephson junction, and a second etch to thin the HTS film in a transition area 35 where the bridge 30 or weak link is to be formed. Thereafter direct write electron beam lithography in combination with an aqueous etch can be employed to form a nanometer dimensioned bridge.

Figure 3:
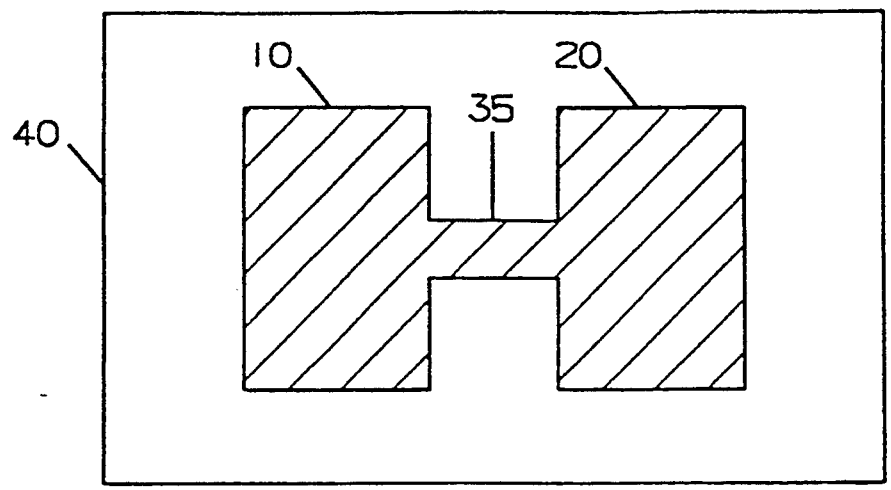
FIG. 3 depicts the thin film of FIG. 2 after mesa etching to form the macro features of a bridge Josephson junction.
Figure 4:
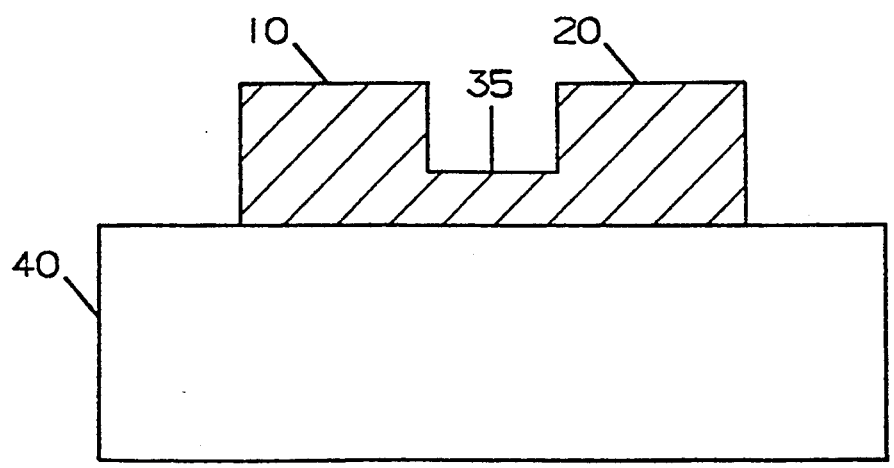
FIG. 4 depicts a cross-sectional view of the thin film of FIG. 3 after thinning of a transition region.

Looking now to FIGS. 2–4, the optical lithographic steps will now be described in more detail. In particular, three optical lithographic process steps are preferably carried out in the following order: deposition of conductive contacts 60, 70; mesa etching of the macro features of the Josephson junction; and thinning of a transition region 35 connecting superconducting regions 10, 20. Those skilled in the art will appreciate that other sequences can also be used; however, the present sequence includes the beneficial result of minimizing degradation of the superconducting character of the HTS material. Preferably a positive image photoresist layer is deposited over the HTS material 50. In a first optical lithographic step, an image reversal technique which yields resist patterns with a re-entry profile suitable for liftoff can be used to deposit contacts 60, 70 on the HTS material 50. In particular, a 1.2 $\mu$m photoresist layer such as AZ 5214E manufactured by AZ Hoechst, can be deposited on the HTS material by any one of a variety of known techniques including spin-deposition. The photoresist is baked on a hot plate at 90° C. for 90 seconds. By selectively exposing the photoresist to UV radiation for approximately 7 seconds with a mask or the like, an image or pattern of contacts 60, 70 can be defined. The undeveloped photoresist is then baked on a hot plate for approximately 30 seconds at 112° C. and thereafter the entire photoresist is flood exposed to UV radiation for approximately 45 seconds. The photoresist can now be developed whereby the original unexposed portions of the photoresist are removed to expose selected portions of the HTS material 50. Developers are basically KOH solutions such as marketed commercially by Shipley under the name MIF-312. In particular a solution of MIF-312 diluted 1:1.4 in deionized water is used for 60 seconds. Employing any one of a variety of known techniques, a conductive material, such as Ag, can be blanket deposited on the exposed HTS material 50 to form contacts 60, 70. Thereafter, the remaining photoresist layer can be removed with acetone which also provides liftoff of the unwanted conductive layer and the contacts 60, 70 are annealed.

In a second optical lithographic step, the macro features of the Josephson junction (i.e. first and second regions 10, 20 and transition region 35) can be defined using a mesa etching process. Initially, a 1.0 $\mu$m layer of positive image photoresist, such as AZ 5214, is spin deposited on the HTS material 50 so as to also cover contacts 60, 70. The photoresist is baked on a hot plate at 90° C. for approximately 90 seconds. Using a masking technique or the like, the photoresist is selectively irradiated with a UV radiation for 3 seconds so as to define an image or pattern of the macro features of the Josephson junction as depicted in FIG. 3. The photoresist can then be developed for 60 seconds with a developer solution, such as AZ 400K marketed by AZ Hoechst. The developed photoresist patterns define the macro features of the Josephson junction depicted in FIG. 3. The exposed HTS material can be mesa-etched as will be more completely described below.

It should be noted that an etching process compatible with positive resists is required to fabricate the submicron feature sizes since process-induced distortions limit negative resists to 2–3$\mu$m feature sizes. Positive resist processing relies on water-based developers because the resists are soluble in typical organic solvents. Unfortunately, aqueous etching solutions and even deionized water can produce undesirable increases in the high-frequency surface resistance of the HTS film. This degradation is excessive for many device applications of HTS films. Increases in the edge surface resistance resulting from exposure to etchant solutions can dramatically increase total insertion loss. Likewise, the flux dynamics can be dramatically affected by etch-induced damage at the edges since the flux entry and exit events at the edges strongly affect noise performance.

Previous attempts to limit the damage of aqueous etchants for copper-based HTS materials employed etchant solutions that contained dissolved atmospheric gases ($O_2$ and $CO_2$). However, it has been found that removing dissolved $CO_2$ and $O_2$ from the etching solution can lead to profound improvements in surface resistance after aqueous processing. The preferred etchant is a solution of disodium ethylenediaminetetraacetic acid ($Na_2H_2EDTA$). When the etchant $Na_2H_2EDTA$ solution is so prepared, it gives a better than 50% reduction in degradation and a change in surface resistance that is less than 5% for HTS materials.

By way of example, $0.15 \pm 0.05$-$\mu$m films of (YBCO) having $T_c$'s of approximately 90K and critical current densities of approximately 1 $MA/cm^2$ at 77K and $0.3 \pm 0.02$-m films of $Tl_2Ba_2Ca_2Cu_3O_x$(TBCCO) having $T_c$'s of approximately 102K and critical current densities of approximately 250 $kA/cm^2$ at 77K were evaluated with such etchant. The effects of dissolved $CO_2$ and $O_2$ on both etch-through times and surface resistance for YBCO and TBCCO were examined with and without degassing of the etchant solution. The etching solutions were "degassed" by bubbling $N_2$ through them for 10 min before beginning to etch and during the etching and rinse procedures. This entrains and removes dissolved atmospheric gases and provides a $N_2$ "blanket" to reduce the $CO_2$ and $O_2$ pressures in equilibrium at the $H_2O$ surface. The uncertainty in the etch-through times is approximately 10 s for multi-minute etching times.

Nearly half of the increase in the surface resistance of copper-based HTS films in aqueous etchants has been determined to be due to the presence of dissolved $CO_2$. Decarbonation of the solution and exclusion of contact with atmospheric $CO_2$ by the simple technique of bubbling $N_2$ through the etchant solution can produce a profound improvement in the film's surface resistance following processing. Surface degradation of the HTS film can be further reduced by adjusting the $H^+$ concentration to make $H_2EDTA^{-2}$ the dominant solution species for EDTA-based etching solutions. The preferred etchant is a decarbonated $Na_2H_2EDTA$ solution for fabricating devices using positive photoresists. This etchant will etch both YBCO and TBCCO films at convenient rates while increasing the high-frequency surface resistance by less than 5%. Surface resistance degradation produced by other aqueous processing solutions may be similarly minimized by decarbonating the solutions by bubbling N before and during processing.

After completing the mesa etching step, the remaining photoresist is removed using acetone. A third layer of photoresist can now be deposited in fashion similar to the second layer. Once again the photoresist is exposed to UV radiation for approximately 3 seconds so as to define only the transition region 35. The photoresist is developed with a solution of AZ 400K diluted 1:4 in deionized water for 60 seconds and the exposed photoresist removed exposing the transition region 35. The transition region 35 is now etched, using the preferred etchant, to thin the transition region 35 from its original thickness of ~25 nm to a new thickness of ~10 nm. It has been found that reducing the thickness of the HTS material 50 in the transition region 35 where the weak link or bridge is to be formed minimizes the etch time and thereby minimizes the possibility of undercutting by the etchant and thus ensures a more uniform and reproducible weak link or bridge.

For the electron beam lithography step, a 100 nm thick PMMA resist layer is deposited on the remaining HTS film 50 and baked for one hour at 170° C. A JEOL JBX-5FE field-emission electron beam lithography system with a beam current of 800 pA at a beam diameter of 6 nm is employed to expose the resist. Prior to exposure, a thin gold layer (~10 nm) is thermally evaporated onto the resist film to provide a current path for the incident electrons. Similar other conductive metals (e.g. Al) can also be employed. Prior to development of the resist, the gold film is removed in a standard potassium iodide/iodine (KI/I) etch. Note that the HTS film is entirely protected by the resist during the gold etch and does not come in contact with the KI/I solution. Development was performed for 60 seconds in 1:3 MIBK:IPA solution.

Figure 5:
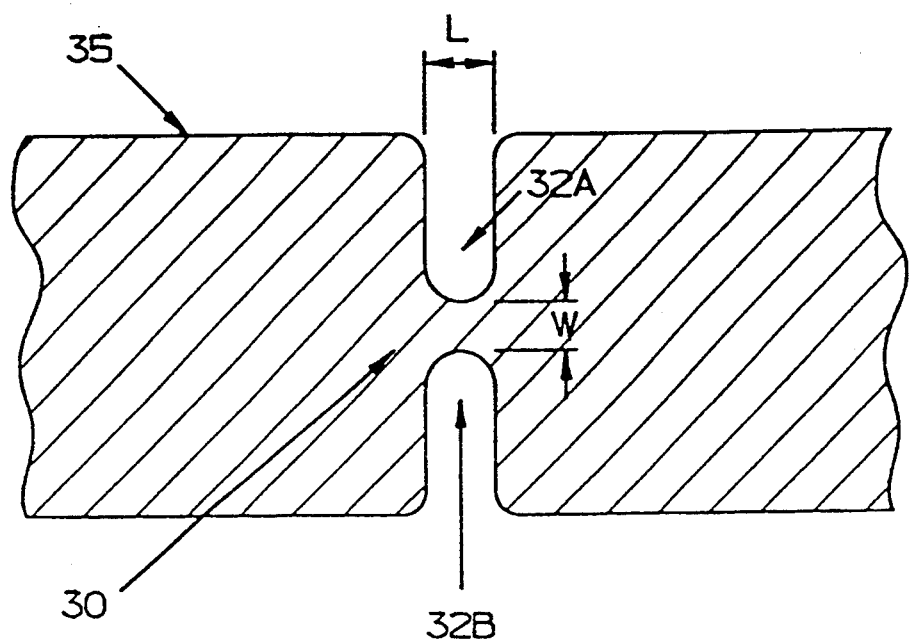
FIG. 5 provides enlarged view of the bridge within the dashed circle A depicted in FIG. 1.

A weak link or bridge 30 can now be fabricated by forming notches 32a, 32b on both sides of the thinned transition region 35. The geometry of a discrete nanobridge 30 is shown in FIG. 5. Notches in the resist were patterned by exposure to pairs of single-pass, opposed electron beam lines with doses between 2.3 and 4 nC/cm to obtain lithographically-defined bridge lengths of 20 to 80 nm. Such bridge lengths are of the order of the coherence length of the HTS material. The effective bridge length l is smaller due to curvature of the lithographically-defined pattern (see FIG. 5). The bridge width w can be varied in the computer-aided design (CAD) pattern down to ~5 nm but must be biased upwards to account for the beam diameter of the exposing electron beam and finite undercut during the wet etch. The exposed resist is developed using a solution of methylisobutylketone (MIBK) and isopropyl alcohol (IPA). After developing the resist, as before, a decarbonated $NA_2H_2EDTA$ etch was used to form notches 32a, 32b in the HTS film 50 resulting in the formation of bridge 30. Because the HTS film 50 is thin (10 nm) in the transition region 35 and the etch rate of the aqueous etch is slow, no uncontrolled undercutting of the HTS material during the wet etch occurred. Thereafter the remaining resist can be removed.

Figure 6:
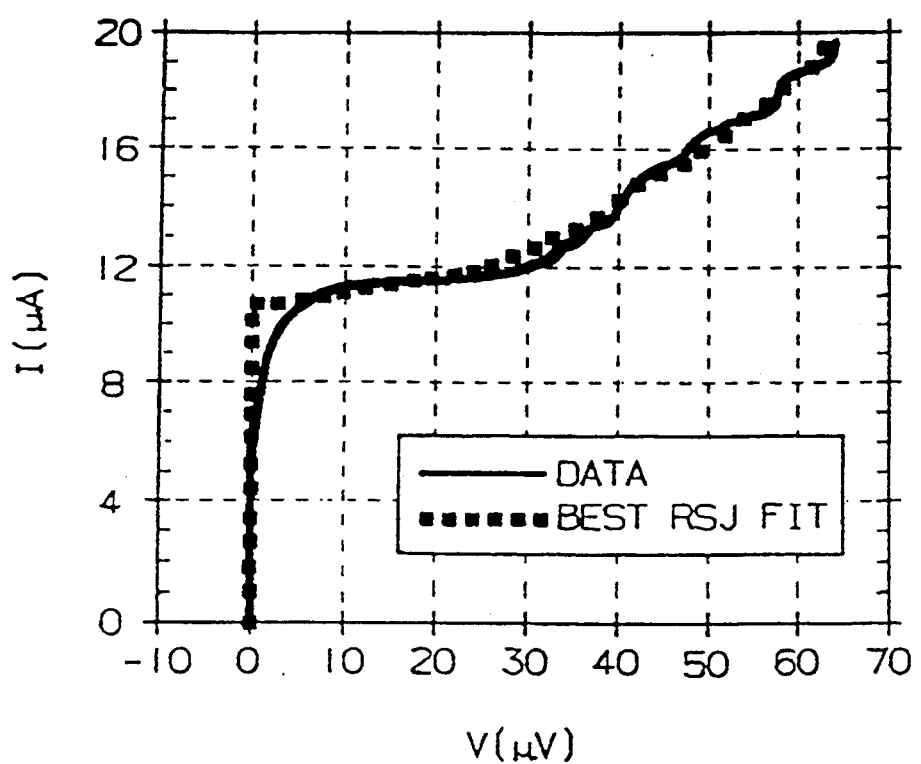
FIG. 6 depicts a current-voltage curve for a Josephson junction according to the present invention.
Figure 7:
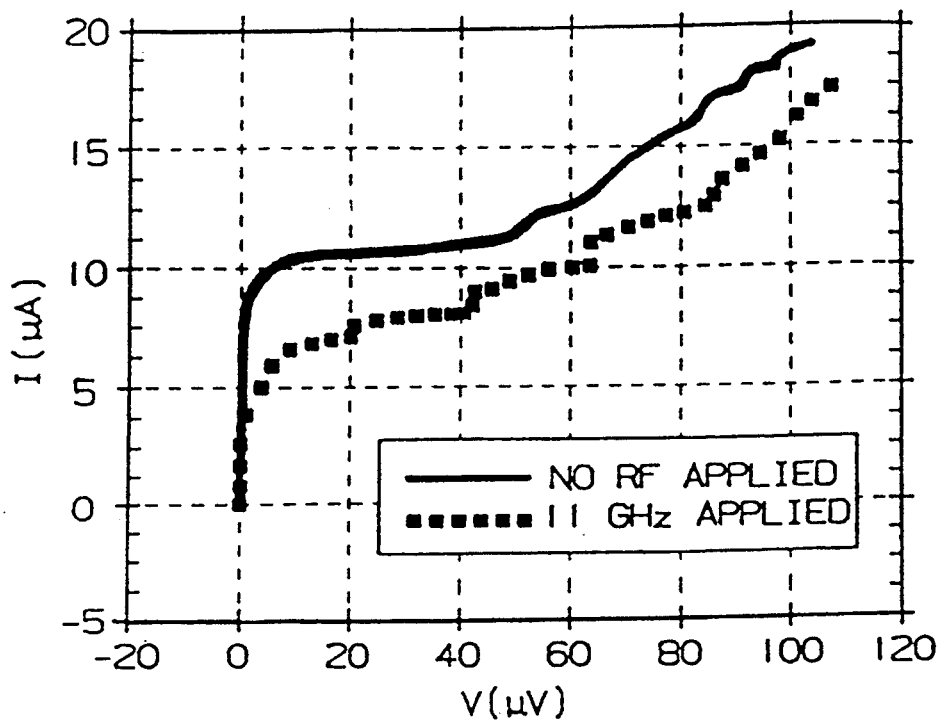
FIG. 7 depicts a current-voltage curve for a Josephson junction according to the present invention upon the application of a 11 GHz field.
Figure 8:
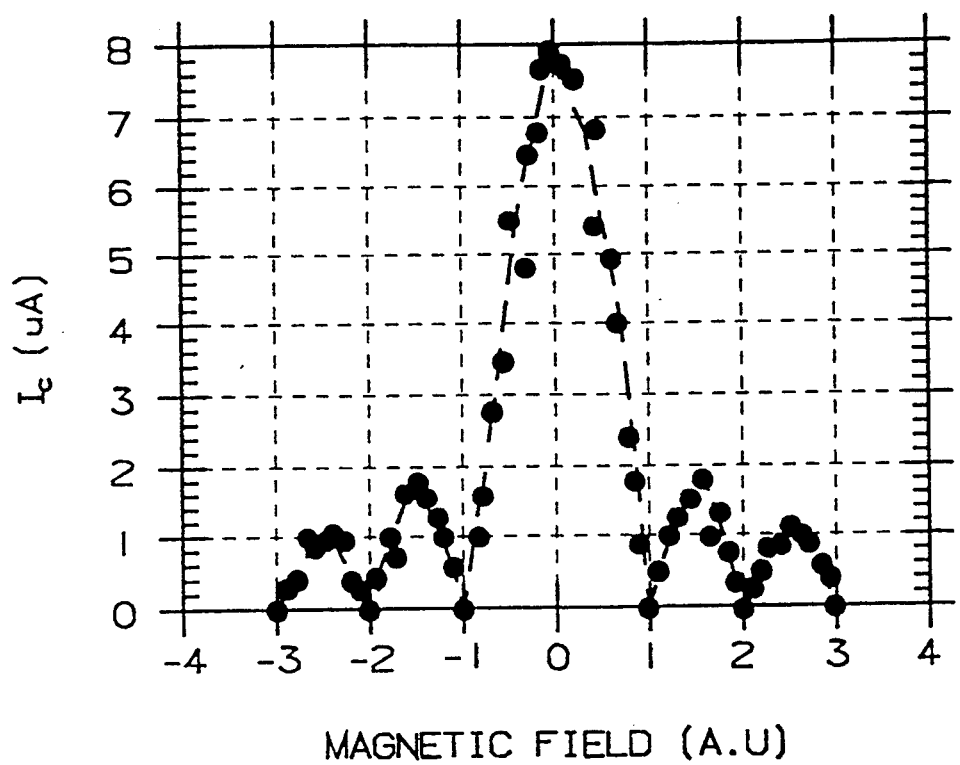
FIG. 8 depicts the relation of current with applied magnetic field for Josephson junctions according to the present invention.

A plurality of functional nanometer dimensioned bridge junctions were manufactured on a single substrate according to the present invention and exhibited critical currents in the range of 4 to 20 μA and $IcR_n$ products of 10 to 100 μV at 77K, close to results for other HTS technologies. A typical current-voltage (I-V) curve measured at 77K for a Josephson nanobridge is shown in FIG. 6. The I-V curve is nearly ideal, following the standard resistively-shunted junction (RSJ) model. The I-V curve of the same junction upon application of an 11 GHz field is shown in FIG. 7. The dependence of current step magnitude on field amplitude was found to be consistent with that of the low capacitance RSJ model. A plot showing the dependence of the critical current with applied magnetic field is shown in FIG. 8. The magnetic field dependence is very close to the ideal $\sin(kI_c)/(kI_c)$, suggesting an extremely uniform junction. Yield showed a very weak dependence on the length of the nanobridge, but the width dimension was very important. As would be expected, the narrower bridges (in terms of the gap defined in the CAD pattern) had much higher yields (~60%) and it is believed that the small widths achieved were aided by limited undercutting by the etch. Moreover, yield did not decrease with decreasing bridge dimensions. The need for precise control of the lithographic process is clear. If the etch-mask-defined gap is too small, then any appreciable undercutting of the mask by the aqueous etch would be expected to result in a zero-width bridge or open circuit. Conversely, if the etch-mask-defined gap is too large, then one can be relying solely on undercut to achieve appropriate dimensions for bridge formation which could not be expected to be a high yield process. We found that critical currents were constant to within 15% for bridge junctions with equal CAD-defined gaps and written with the same electron beam dose.

Figure 9:
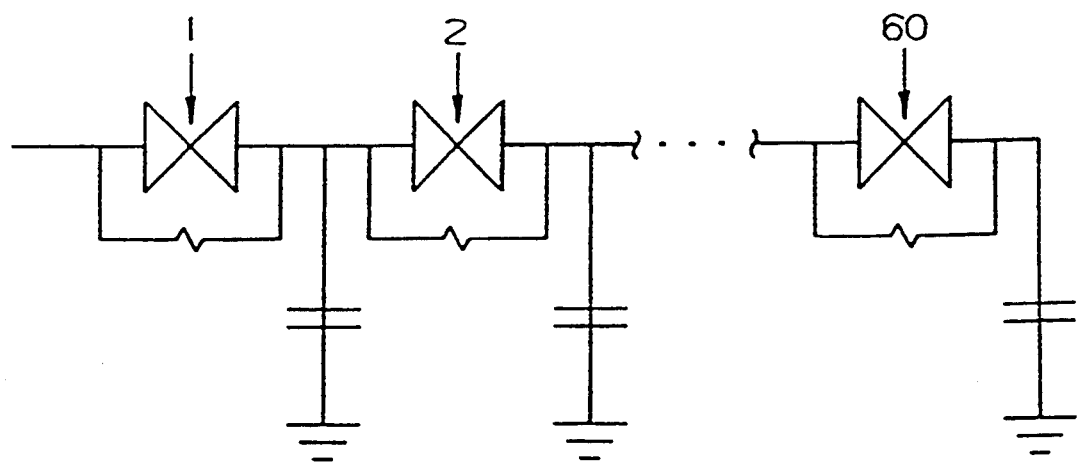
FIG. 9 is a schematic diagram of a series of Josephson junctions according to the present invention.
Figure 10:
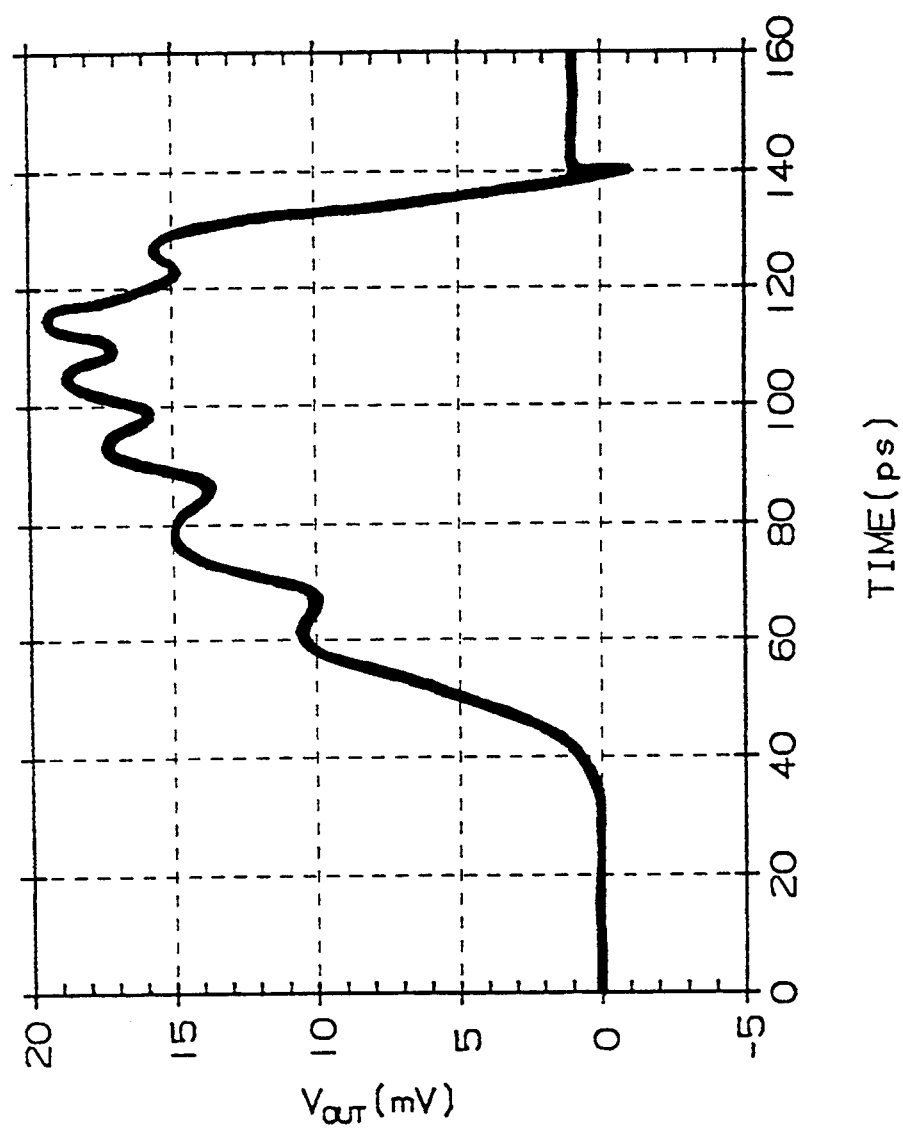
FIG. 10 is a representation of the results of impressing a known signal on the system depicted in FIG. 9.

By way of example, a serial system of about 60 Josephson junctions $J_i$ was fabricated and is depicted schematically in FIG. 9. Such systems can be employed as pulse formers to develop very narrow impulses or rapid pulse edge transition. The data depicted in FIG. 10 represent the result of impressing a pulse with rise and fall times approximately equal to 20 ps and amplitude of 50 μA to the system of FIG. 8. The measured fall time depicted in FIG. 10 is approximately 12 ps.

In summary, we have used electron beam lithography in combination with an improved aqueous etch to fabricate superconducting nanobridges of HTS material with dimensions on the order of 20 nm. Neither the electron beam lithographic process nor the aqueous etch was seen to degrade the characteristics of the HTS material. Having thus described the invention in detail, those skilled in the art will appreciate that changes thereto can be made without departing from the scope of the claims attached herewith.

We claim:
1. A lithographic process for fabricating nanometer dimensioned bridges connecting first and second regions of material in an electronic device, comprising the steps of:
 a) lithographically forming a transition region of material connecting first and second regions, wherein said first, second and transition regions are coplanar;
 b) depositing a resist material atop the first, second and transition regions;
 c) selectively irradiating the resist with an electron beam and defining a bridge pattern of irradiated resist material atop the transition region;
 d) removing the irradiated resist material and exposing a bridge pattern of transition region material; and
 e) removing the exposed transition region material with an etchant and forming a bridge connecting said first and second regions, wherein said bridge has a length less than 100 nm.
2. The method of claim 1 wherein the material of said first and second regions is a superconducting material.

3. The method of claim 2, wherein said material is a high temperature superconducting material ($T_c > 77K$).

4. The method of claim 1, wherein said resist material is a positive image resist.

5. The method of claim 1, wherein said bridge has a width less than 100 nm.

6. The method of claim 1, wherein the bridge pattern of irradiated resist material is formed from a pair of single pass, opposed lines of an electron beam.

7. The method of claim 1, wherein the step of lithographically defining a transition region includes:
  a) optical lithographically forming a pattern defining first, second and transition regions of a material deposited on a substrate;
  b) mesa etching the material according to the pattern so as to form first, second and transition regions; and
  c) selectively thinning the transition with respect to the first and second regions.

8. The method of claim 1, wherein the etchant is an aqueous etchant.

9. The method of claim 1, wherein the etchant is $Na_2H_2EDTA$.

10. The method of claim 1, wherein the etchant is decarbonated.

11. The method of claim 3, wherein the bridge length is of the order of the coherence length of the superconducting material.

* * * * *